(12) United States Patent
Miyazawa et al.

(10) Patent No.: US 9,673,282 B2
(45) Date of Patent: Jun. 6, 2017

(54) HANDLE SUBSTRATES OF COMPOSITE SUBSTRATES FOR SEMICONDUCTORS, AND COMPOSITE SUBSTRATES FOR SEMICONDUCTORS

(71) Applicant: NGK INSULATORS, LTD., Aichi-prefecture (JP)

(72) Inventors: Sugio Miyazawa, Kasugai (JP); Yasunori Iwasaki, Kitanagoya (JP); Tatsuro Takagaki, Nagoya (JP); Akiyoshi Ide, Kasugai (JP); Hirokazu Nakanishi, Nagoya (JP)

(73) Assignee: NGK INSULATORS, LTD., Aichi-prefecture (JP)

(*) Notice: Subject to any disclaimer, the term of this patent is extended or adjusted under 35 U.S.C. 154(b) by 0 days.

(21) Appl. No.: 14/835,960

(22) Filed: Aug. 26, 2015

(65) Prior Publication Data

US 2015/0364548 A1    Dec. 17, 2015

Related U.S. Application Data

(63) Continuation of application No. PCT/JP2015/050576, filed on Jan. 13, 2015.

(30) Foreign Application Priority Data

Feb. 12, 2014    (JP) .................................. 2014-024544

(51) Int. Cl.
*H01L 29/06*    (2006.01)
*H01L 29/16*    (2006.01)
(Continued)

(52) U.S. Cl.
CPC ............ *H01L 29/16* (2013.01); *C04B 35/115* (2013.01); *C04B 35/6264* (2013.01);
(Continued)

(58) Field of Classification Search
CPC ..... Y10T 428/24372; Y10T 428/24355; Y10T 428/24942; H01L 29/06; H01L 21/02178;
(Continued)

(56) References Cited

U.S. PATENT DOCUMENTS 3,335,038 A * 8/1967 Doo .................. H01L 27/00
117/73
3,518,503 A * 6/1970 Doo .................. H01L 21/00
257/E31.042
(Continued)

FOREIGN PATENT DOCUMENTS

JP    05-160240 A    6/1993
JP    08-512432 A    12/1996
(Continued)

OTHER PUBLICATIONS

Machine translation (J-PlatPat) of JP 2012-238654 A. Translated Apr. 26, 2016.*
(Continued)

*Primary Examiner* — Maria Veronica Ewald
*Assistant Examiner* — Ethan A Utt
(74) *Attorney, Agent, or Firm* — Cermak Nakajima & McGowan LLP; Tomoko Nakajima

(57) ABSTRACT

A handle substrate of a composite substrate for a semiconductor is provided. The handle substrate is composed of polycrystalline alumina. The handle substrate includes an outer peripheral edge part with an average grain size of 20 to 55 μm and a central part with an average grain size of 10 to 50 μm. The average grain size of the outer peripheral edge part is 1.1 times or more and 3.0 times or less of that of the central part of the handle substrate.

2 Claims, 4 Drawing Sheets

(51) Int. Cl.
| | |
|---|---|
| *H01L 21/20* | (2006.01) |
| *C04B 35/115* | (2006.01) |
| *C30B 29/06* | (2006.01) |
| *C30B 33/06* | (2006.01) |
| *C04B 35/632* | (2006.01) |
| *C04B 35/634* | (2006.01) |
| *C04B 37/00* | (2006.01) |
| *C04B 35/626* | (2006.01) |

(52) U.S. Cl.
CPC .......... *C04B 35/632* (2013.01); *C04B 35/634* (2013.01); *C04B 37/001* (2013.01); *C04B 37/005* (2013.01); *C04B 37/008* (2013.01); *C30B 29/06* (2013.01); *C30B 33/06* (2013.01); *H01L 21/2007* (2013.01); *H01L 29/0649* (2013.01); *C04B 2235/3206* (2013.01); *C04B 2235/3225* (2013.01); *C04B 2235/3244* (2013.01); *C04B 2235/5409* (2013.01); *C04B 2235/5445* (2013.01); *C04B 2235/6023* (2013.01); *C04B 2235/6582* (2013.01); *C04B 2235/661* (2013.01); *C04B 2235/662* (2013.01); *C04B 2235/786* (2013.01); *C04B 2237/062* (2013.01); *C04B 2237/064* (2013.01); *C04B 2237/08* (2013.01); *C04B 2237/34* (2013.01); *C04B 2237/343* (2013.01); *C04B 2237/36* (2013.01); *C04B 2237/52* (2013.01); *C04B 2237/588* (2013.01); *Y10T 428/24355* (2015.01)

(58) Field of Classification Search
CPC H01L 21/02; B32B 5/14; B32B 5/142; B32B 5/147
USPC .......................................... 428/143, 141, 212
See application file for complete search history.

(56) References Cited

U.S. PATENT DOCUMENTS

| | | | | |
|---|---|---|---|---|
| 4,285,732 | A | * | 8/1981 | Charles ................. C04B 35/115 501/153 |
| 5,382,556 | A | * | 1/1995 | Takahashi ............. C04B 35/115 501/153 |
| 6,090,648 | A | | 7/2000 | Reedy et al. |
| 6,908,828 | B2 | | 6/2005 | Letertre et al. |
| 8,314,007 | B2 | | 11/2012 | Vaufredaz |
| 8,505,197 | B2 | | 8/2013 | Blanchard |
| 2004/0140297 | A1 | * | 7/2004 | Tanaka ............... B23K 26/0661 219/121.6 |
| 2012/0119336 | A1 | | 5/2012 | Akiyama |

FOREIGN PATENT DOCUMENTS

| | | | |
|---|---|---|---|
| JP | 11-026339 | A | 1/1999 |
| JP | 2003-224042 | A | 8/2003 |
| JP | 2009-102181 | A | 5/2009 |
| JP | 2010-278341 | A | 12/2010 |
| JP | 2011-071487 | A | 4/2011 |
| JP | 2011-159955 | A | 8/2011 |
| JP | 2012238654 | A * | 12/2012 |
| WO | WO2010/128666 | A1 | 11/2010 |

OTHER PUBLICATIONS

International Search Report and Written Opinion for PCT Patent App. No. PCT/JP2015/050576 (Apr. 14, 2015) with English translations of the Search Report and relevant parts of the Opinion.
International Preliminary Report on Patentability for PCT Patent App. No. PCT/JP2015/050576 (Aug. 25, 2016).

\* cited by examiner

Number of grains = 22, 23, 19
(at different three positions)

HANDLE SUBSTRATES OF COMPOSITE SUBSTRATES FOR SEMICONDUCTORS, AND COMPOSITE SUBSTRATES FOR SEMICONDUCTORS

TECHNICAL FIELD

The present invention relates to a handle substrate of a composite substrate for a semiconductor, and a composite substrate for a semiconductor.

BACKGROUND ARTS

The so-called SOS substrate is used in a high frequency switching IC or the like. The SOS substrate is an adhered substrate that includes a base substrate of sapphire having characteristics of high insulation, low dielectric loss and high thermal conduction, and a silicon thin film formed on the surface of the base substrate to configure a semiconductor device. Conventionally, a main method for forming the SOS substrate involves forming a silicon layer on the base substrate by epitaxial growth. On the other hand, in recent years, a method that bonds the silicon layer directly onto the base substrate has been developed to contribute to improve the performance of semiconductor devices (Patent Documents 1, 2, and 3).

With the progress in bonding techniques, various base substrates other than that made of sapphire have been proposed. Among them, polycrystalline transparent alumina has been used for a luminous vessel for a high-luminance discharge lamp and a dummy wafer of a semiconductor manufacturing device. The polycrystalline transparent alumina is produced by densely sintering a high-purity raw material under a reducing atmosphere at a high temperature. The thus-produced polycrystalline transparent alumina has the advantages of eliminating the necessity for a high-cost crystal growing step while maintaining the excellent characteristics of high insulation, low dielectric loss and high thermal conduction comparable with those of the sapphire (Patent documents 4, 5 and 6).

In fabricating the adhered substrate by directly bonding the silicon layer to the base substrate, a difference in thermal expansion between the base substrate and the silicon layer or the like might cause poor adhesion at the outer periphery of the adhered substrate. The silicon layer may thereby be peeled off from the base substrate in a mechanical process or etching process after bonding (Patent documents 7 and 8).

CITATION LIST

Patent Document

Patent document 1: Japanese Patent Publication No. H08 (1996)-512432A
Patent document 2: Japanese Patent Publication No. 2003-224042A
Patent document 3: Japanese Patent Publication No. 2010-278341A
Patent Document 4: WO 2010/128666
Patent document 5: Japanese Patent Publication No. 1105 (1993)-160240A
Patent document 6: Japanese Patent Publication No. H11 (1999)-026339A
Patent document 7: Japanese Patent Publication No. 2011-071487A
Patent document 8: Japanese Patent Publication No. 2011-159955A

SUMMARY OF THE INVENTION

If the grain size of grains at a bonding face of a handle substrate is set large, the number of grain boundaries per unit area at the face decreases to lessen the influence of uneven parts of the handle substrate provided by the grains exposed at the face. Thus, the adhesion strength of the handle substrate with a donor substrate is increased, whereby the handle substrate is less likely to be peeled from the donor substrate in a post-process. However, in this case, the strength of the handle substrate itself decreases, causing cracks to easily occur. On the other hand, if the grain size of grains at a bonding face of the handle substrate is set small, the strength of the handle substrate increases, which hardly generate cracks. However, in a post-process, the peeling from the donor substrate is apt to occur.

An object of the present invention is to provide a handle substrate comprised of polycrystalline alumina that suppresses occurrence of cracks while being prevented from peeling off a donor substrate.

The present invention provides a handle substrate of a composite substrate for a semiconductor, said handle substrate comprising polycrystalline alumina;
wherein said handle substrate comprises an outer peripheral edge part with an average grain size of 20 to 55 μm;
wherein said handle substrate comprises a central part with an average grain size of 10 to 50 μm; and
wherein the average grain size of said outer peripheral edge part of said handle substrate is 1.1 times or more and 3.0 times or less of that of said central part of said handle substrate.

Further, the invention is directed to a composite substrate for a semiconductor which includes the handle substrate, and a donor substrate bonded to a bonding face of the handle substrate.

Accordingly, the invention can improve the adhesion of the handle substrate to the donor substrate, thereby suppressing the peeling-off of these substrates, and can also enhance the strength of the handle substrate at the same time, thereby suppressing the occurrence of cracks.

In particular, the grain size of the outer peripheral edge part of the handle substrate is relatively enlarged, which can improve the adhesion to the donor substrate at the outer peripheral edge part. The reason why this effect becomes significant is that since the peeling of the donor substrate mainly progresses from the outer peripheral edge part, the improvement of the adhesion at the outer peripheral edge part of the handle substrate is very effective. At the same time, the improvement of the strength of the handle substrate by relatively decreasing the grain size of the central part of the handle substrate is extremely effective at suppressing cracks across the entire handle substrate.

DESCRIPTION OF EMBODIMENTS

The present invention will be described in more detail below with reference to the accompanying drawings as appropriate.

(Applications)

A composite substrate of the invention can be used for light emitting elements for projectors, high-frequency devices, high-performance lasers, power devices, logic ICs, etc.

(Donor Substrate)

The composite substrate includes a handle substrate according to the invention and a donor substrate. Examples of materials for the donor substrate include, but not limited thereto, preferably, one selected from the group consisting of silicon, aluminum nitride, gallium nitride, zinc oxide, and diamond.

The donor substrate contains the above-mentioned material, and may have an oxide film on its surface. This is because ion implantation through the oxide film can exhibit the effect of suppressing channeling of the implanted ions. The oxide film preferably has a thickness of 50 to 500 nm. The donor substrate with the oxide film is implied in the term "donor substrate" as used herein and will be referred to as the "donor substrate" unless otherwise specified.

(Handle Substrate)

Figure 1A:
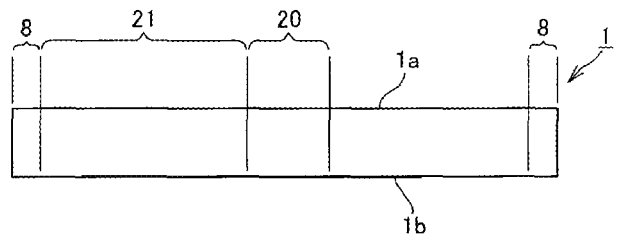
FIG. 1(a) is a front view of a handle substrate 1.
Figure 3A:
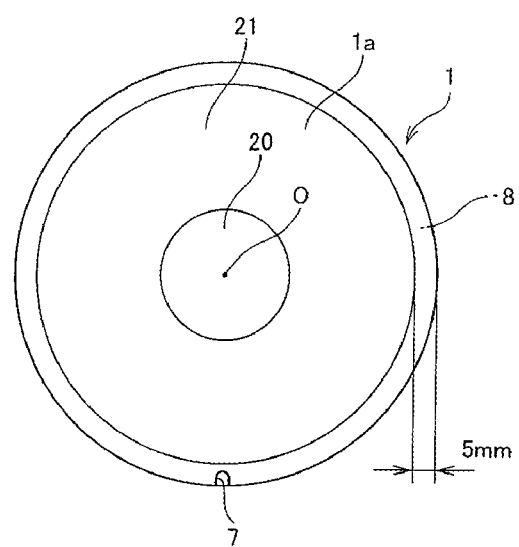
FIG. 3(a) is a plan view showing a wafer-like substrate 1.

As shown in FIGS. 1 and 3, a handle substrate 1 has, for example, a circular shape and is provided with a notch 7 in one position. The notch 7 shown in FIG. 3(a) has a U-character shape, but may have a V-character shape. Such a notch is used to detect the position or direction of wafer when performing various operations in manufacturing procedures of semiconductor devices. In particular, in a wafer having a size of 8 inches or more, the notch is introduced as a general detection means, in place of an orientation flat. It is obvious that an orientation flat may be provided instead of the notch.

Figure 3B:
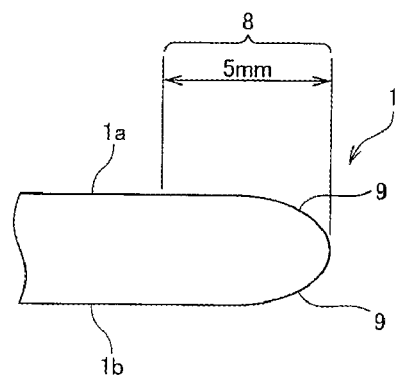
FIG. 3(b) is a diagram showing an outer peripheral edge part of the substrate 1.

The so-called bevels 9 are provided at the edge of the outer peripheral edge part 8 of the wafer-like substrate 1 (see FIG. 3(b)). The bevels are formed on both sides of a bonding face 1a and a backside 1b. The term "bevel" as used herein means an inclined part at an end surface and a peripheral edge of the wafer.

In the invention, the handle substrate is formed of polycrystalline alumina. The outer peripheral edge part 8 of the handle substrate has an average grain size of 20 to 55 μm. A central part 20 of the handle substrate has an average grain size of 10 to 50 μm. The average grain size of the outer peripheral edge part 8 of the handle substrate is 1.1 times or more and 3.0 times or less as large as that of the central part 20.

The average grain size of the outer peripheral edge part of the handle substrate is set to 20 μm or more, thereby improving the adhesion to the donor substrate. From this viewpoint, the average grain size of the outer peripheral edge part of the handle substrate is preferably 25 μm or more, and more preferably, 30 μm or more.

The average grain size of the outer peripheral edge part of the handle substrate is set to 55 μm or less, thereby enabling prevention of the occurrence of cracks. From this viewpoint, the average grain size of the outer peripheral edge part of the handle substrate is more preferably 50 μm or less.

The average grain size of the central part 20 of the handle substrate is set to 10 μm or more, thereby improving the adhesion to the donor substrate. From this viewpoint, the average grain size of the central part of the handle substrate is preferably 15 μm or more, and more preferably, 20 μm or more. On the other hand, the average grain size of the central part 20 of the handle substrate is set to 50 μm or less, thereby enabling prevention of the occurrence of cracks. From this viewpoint, the average grain size of the central part of the handle substrate is preferably 45 μm or less, and more preferably, 35 μm or less.

The average grain size of the outer peripheral edge part 8 of the handle substrate is set 1.1 times or more of that of the central part 20, thereby enabling suppression of peeling-off of the handle substrate. From this viewpoint, the average grain size of the outer peripheral edge part 8 of the handle substrate is more preferably set 1.3 times or more of that of the central part 20. If the average grain size of the outer peripheral edge part 8 of the handle substrate is set excessively larger than that of the central part 20, micro cracks tend to occur in an intermediate part 21. Thus, the average grain size of the outer peripheral edge part 8 of the handle substrate is set 3.0 times or less of that of the central part 20. From this viewpoint, the average grain size of the outer peripheral edge part 8 of the handle substrate is more preferably set 2.8 times or less of that of the central part 20.

Here, the average grain size of the crystal grain is measured as follows.

(1) The section of the handle substrate is subjected to mirror face polishing and then thermal etching, emphasizing grain boundaries. Then, a microscopic photograph of the section (at 100 to 200-fold magnification) is taken, and the number of grains passing through a straight line with a unit length is counted. The microscopic photograph is taken within a range of 100 μm from the bonding face. This measurement is performed at three different positions. Note that the unit length is set to a range of 500 μm to 1000 μm.

(2) The numbers of grains performed at the three positions are averaged.

(3) The average grain size is calculated by the following formula.

$$D = (4/\pi) \times (L/n) \quad \text{[Calculation Formula]}$$

[D: Average grain size, L: Unit length of straight line, n: Average of the numbers of grains at three positions]

Figure 2:
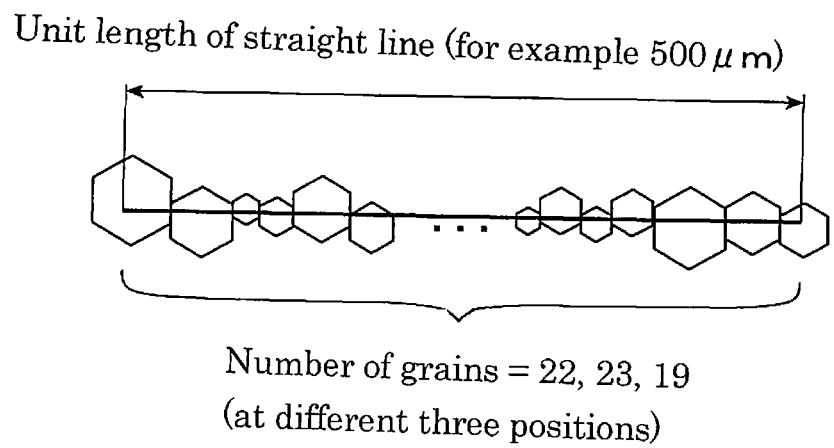
FIG. 2 is a schematic diagram showing an example of a calculation method for an average grain size.

An example of calculation of the average grain size is shown in FIG. 2.

When the numbers of grains passing through the straight line with the unit length (e.g., 500 μm) at the respective three different positions are 22, 23, and 19, the average grain size D is determined based on the above-mentioned calculation formula as follows.

$$D = (4/\pi) \times [500/\{(22+23+19)/3\}] = 29.9 \text{ μm}.$$

The outer peripheral edge part 8 of the handle substrate indicates a ring-shaped part with a width of 5 mm extending from the edge of the handle substrate 1 to the center O thereof. The central part 20 of the handle substrate indicates a circular part having a radius of 5 mm from the center O. The intermediate part 21 is a ring-shaped intermediate part located between the central part 20 and the outer peripheral edge part 8.

The average grain size of the intermediate part 21 is preferably in a range of 10 to 50 μm. Further, the average grain size of the intermediate part 21 is more preferably 15 μm or more, and much more preferably 20 μm or more. On the other hand, the average grain size of the intermediate part 21 is preferably 45 μm or less, and more preferably 35 μm or less.

The average grain size of the outer peripheral edge part 8 of the handle substrate is preferably set 1.1 times or more and 3.0 times or less of the intermediate part 21. The average grain size of the outer peripheral edge part 8 of the handle substrate is more preferably set 1.3 times or more of that of the intermediate part 21, and 2.8 times or less of that of the intermediate part 21. Further, the average grain size of the intermediate part 21 is preferably substantially same as that of the central part 20.

In a preferred embodiment, the bonding face of the handle substrate has a surface roughness Ra of 2 nm or less. If the surface roughness is large, the bonding strength of the donor substrate is decreased due to an intermolecular force. Accordingly, most preferably, the surface roughness is 1 nm or less. Note that the surface roughness Ra of the bonding face is a numerical value obtained by taking an image of 70 μm×70 μm as the vision range with AFM (Atomic Force Microscope) and by calculating based on JIS B0601.

A relative density of alumina ceramics is preferably set to 98% or more, and more preferably to 99% or more in terms of durability and contamination prevention during the post-processing of the semiconductor.

In the preferred embodiment, a polycrystalline ceramics sintered body forming the handle substrate is produced by sintering ceramic powder with a purity of 99.9% or higher as a raw material.

In the case of producing transparent alumina, 100 ppm or more and 300 ppm or less of magnesium oxide powder is added to high-purity alumina powder that preferably has a purity of 99.9% or higher (more preferably 99.95% or higher). Such high-purity alumina powder can include high-purity alumina powder produced by Taimei Chemical Industries Corporation by way of example. Further, the magnesium oxide powder may preferably has a purity of 99.9% or higher and an average grain size of 0.3 μm or smaller, respectively.

In a preferred embodiment, 200 to 800 ppm of zirconia ($ZrO_2$) and 10 to 30 ppm of yttria ($Y_2O_3$) as sintering aids are preferably added to the alumina powder.

A method for forming a polycrystalline ceramic sintered body is not specifically limited, and may be any method including a doctor blade method, an extrusion process, a gel cast molding, and the like. In particular, preferably, a blank substrate is manufactured by the gel cast molding method.

In the preferred embodiment, a slurry containing the ceramic powder, a dispersing agent and a gelling agent is produced and charged into a die to be gelatinized, thereby producing a molded body. Here, in the gel cast molding stage, a mold release agent is applied to die parts, the die parts are assembled, and then the slurry is charged into the die. Then, the gel is hardened in the die, thereby producing the molded body, which is removed from the die. Thereafter, the die is cleaned.

Next, the gel molded body is dried, and preferably, calcined in air and then completely sintered in hydrogen. The sintering temperature in this sintering process is preferably in a range of 1700 to 1900° C., and more preferably in a range of 1750 to 1850° C. in terms of densification of the sintered body.

Figure 4:
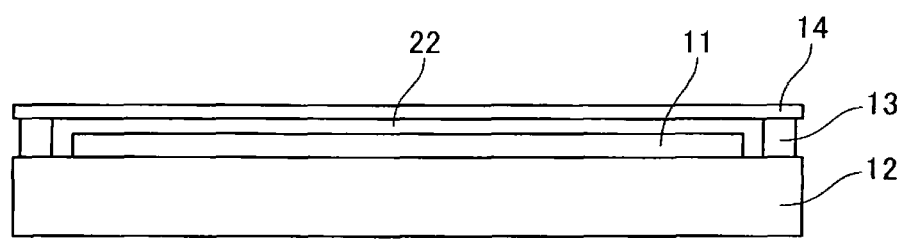
FIG. 4 is a schematic diagram showing a setter for sintering a molded body 11.

In a preferred embodiment, as shown in FIG. 4, the molded body (or calcined body) 11 is mounted on a setter 12, and a lid 14 made of corrosion resistant material is placed to cover the molded body. A spacer 13 is disposed between the lid 14 and the setter 12, creating a gap 22 over the molded body 11, from which the discharge of the sintering aid (particularly, magnesium) is promoted. This suppresses grain coarsening.

After generating the fully-dense sintered body in the sintering process, further an annealing treatment may be additionally performed, which can control or correct the warpage of the substrate. From the viewpoint of promoting the discharge of the sintering aids while preventing deformation and occurrence of abnormal grain growth, the annealing temperature is preferably within a range of the maximum temperature in the sintering ±100° C., in which the maximum temperature is more preferably 1900° C. or lower. The annealing time period is preferably in a range of 1 to 6 hours.

Figure 5:
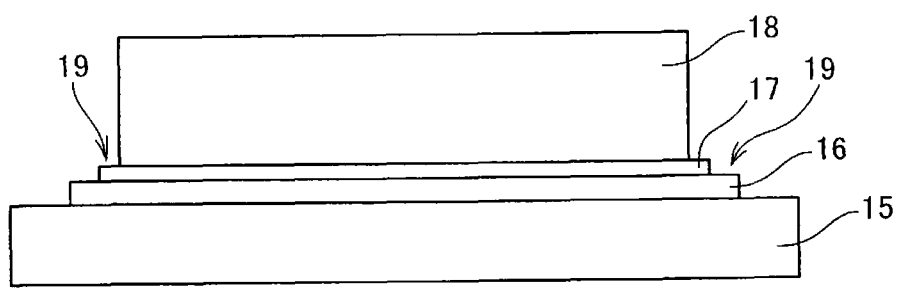
FIG. 5 is a schematic diagram showing a state of a sintered body subjected to an annealing treatment.

Here, in a preferred embodiment, the annealing treatment is performed with the outer peripheral edge part of the sintered body exposed to the atmosphere while the central part and the intermediate part of the sintered body are not exposed to the atmosphere. For example, as shown in FIG. 5, the sintered body 16 is mounted on a setter 15, and a cover 17 is mounted on the sintered body 16 to cover the central part and intermediate part of the sintered body. A weight 18 is mounted on the cover 17, thereby preventing the formation of a gap between the cover 17 and the sintered body 16. In this state, the sintered body is subjected to the annealing treatment, which promotes the discharge of the sintering aids (especially, magnesium) from an exposed part 19 of the outer peripheral edge part into the atmosphere, promoting the grain growth at the outer peripheral edge part, resulting in relative increase in grain size. Since the central part and the intermediate part of the sintered body are not exposed to the atmosphere, the grain growth at the central and intermediate parts is suppressed without discharging the sintering aids.

Materials for the setter, cover, and weight are any material having durability to the atmosphere and temperature in the treatment, and includes, for example, molybdenum, tungsten, cermet, boron nitride, and carbon.

The thus-obtained blank substrate is subjected to precise polishing, resulting in a reduced surface roughness Ra of the bonding face. A general precise polishing is, for example, chemical mechanical polishing (CMP). A polishing slurry suitable for use in this process is one obtained by dispersing abrasive grains having a grain size of 30 nm to 200 nm into alkali or neutral solution. Examples of materials for the abrasive grains can include silica, alumina, diamond, zirconia, and ceria. They are used either alone or in combination. Examples of the polishing pads can include a rigid urethane pad, a non-woven pad, and a suede pad.

The anneal treatment is desirably performed after executing a rough polishing process, before the final precise polishing process. Atmospheric gases suitable for the annealing treatment can include, for example, atmosphere, hydrogen, nitrogen, argon, and vacuum. The annealing temperature is preferably in a range of 1200 to 1600° C., and the annealing time period is preferably in a range of 2 to 12 hours. In this way, an affected layer that would otherwise cause warpage or pits can be removed without degrading the smoothness of the surface.

(Composite Substrate)

The composite substrate is obtained by bonding the handle substrate and the donor substrate together. Techniques suitable for use in the bonding include, but not limited to, for example, direct bonding through surface activation, and a substrate bonding technique using an adhesive layer.

In the direct bonding, a low-temperature bonding technique through surface activation is suitably used. After the surface activation is performed using Ar gas in vacuum of about $10^{-6}$ Pa, a single crystalline material, such as Si, can be bonded to the polycrystalline material via an adhesive layer, such as $SiO_2$, at ambient temperature.

Materials suitable for use in the adhesive layer can include, for example, $SiO_2$, $Al_2O_3$, and SiN, in addition to resin for the adhesion.

Figure 1B:
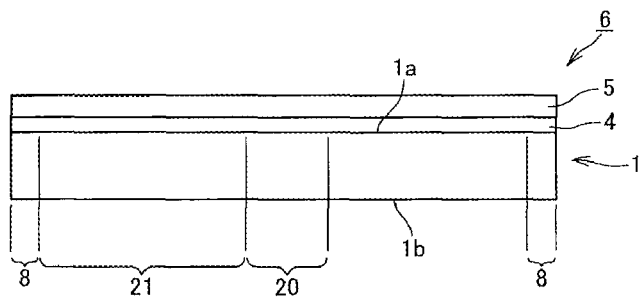
FIG. 1(b) is a front view showing a composite substrate 6 for a semiconductor that includes the handle substrate 1 and a donor substrate 5 which are bonded together via a bonding layer 4.
Figure 1C:
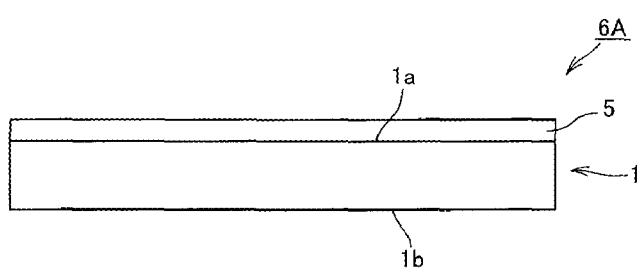
FIG. 1(c) is a front view showing a composite substrate 6A for a semiconductor that includes the handle substrate 1 and the donor substrate 5 which are directly bonded together.

Specifically, in an example shown in FIG. 1(b), the donor substrate 5 is bonded to the bonding face 1a of the handle substrate 1 via the bonding layer 4, thereby producing the composite substrate 6. Further, in an example shown in FIG. 1(c), the donor substrate 5 is directly bonded to the bonding face 1a of the handle substrate 1, thereby producing the composite substrate 6A.

EXAMPLES

Slurry containing the mixture of the following components was prepared.

| (Powdery raw material) | |
|---|---|
| α-alumina powder having a specific surface area of 3.5 to 4.5 m²/g and an average primary grain size of 0.35 to 0.45 μm: | 100 weight parts |
| MgO (magnesia) | 200 ppm |
| ZrO₂ (zirconia) | 400 ppm |
| Y₂O₃ (yttria) | 15 ppm |
| (Dispersing medium) | |
| Dimethyl glutarate | 27 weight parts |
| Ethylene glycol | 0.3 weight parts |
| (Gelatinizer) | |
| MDI resin | 4 weight parts |
| (Dispersing agent) | |
| High molecular surfactant | 3 weight parts |
| (Catalyst) | |
| N,N-dimethylamino hexanol | 0.1 weight parts |

This slurry was charged into the die made of aluminum alloy at room temperature and was allowed to stand at room temperature for one hour. Then, the slurry was allowed to stand at 40° C. for 30 minutes, causing the solidification of the slurry to progress, followed by removal of a solidified body from the die. Further, the solidified body was allowed to stand at room temperature for 2 hours, and then at 90° C. also for 2 hours, thereby producing a plate-shaped powder-molded body.

The thus-obtained powder-molded body was calcined (preliminarily sintered) in air at 1100° C. Then, as shown in FIG. 4, the calcined body was mounted on the setter 12 made of molybdenum, and the lid 14 was placed to cover the calcined body with the gap 22 of 0.1 to 0.5 mm formed over there. In this state, the calcined body was sintered in atmosphere of hydrogen 3:nitrogen 1 at 1700 to 1800° C., thereby producing a sintered body. Then, as shown in FIG. 5, the plate 17 made of molybdenum was mounted on the central part and the intermediate part of the sintered body except for the outer peripheral edge part thereof, and then the weight 18 made of molybdenum was mounted on the plate 17. The sintered body was subjected to the annealing treatment in atmosphere of hydrogen 3:nitrogen 1 at 1700 to 1800° C.

The thus produced blank substrate was subjected to high-precision polishing. First, the blank substrate was subjected to double-sided lapping using green carbon to adjust the shape of both sides of the substrate. Then, the blank substrate was subjected to additional double-sided lapping using diamond slurry. The grain size of the diamond was set to 3 μm. Finally, the substrate was subjected to a CMP process using $SiO_2$ abrasive grains and diamond abrasive grains, and then was washed. Note that this washing process employed RCA washing, which is used for a general semiconductor washing process (specifically, the RCA washing was performed by alternately immersing the substrate in ammonia peroxide, hydrochloric acid peroxide, sulfuric acid, fluoric acid, aqua regia and pure water.) As a result of measurement of the surface roughness of the bonding face with the AFM, the Ra value was 1.0 nm (in □70 μm vision range)

These substrates were examined for the grain size of each part thereof, the peeling in the etching process, and the presence or absence of occurrence of cracks, and the results were shown in Tables 1 and 2. It is noted that the grain sizes of the central parts and the outer peripheral edge parts of the respective substrates were adjusted by changing the temperature of the sintering process, the size of the gap from above the substrate, and the size of the cover placed over the substrate in the annealing treatment after the sintering (range covering the substrate). In any examples, the grain size of the intermediate part was the same as that of the central part.

TABLE 1

| Examples | 1 | 2 | 3 | 4 | 5 | 6 | 7 |
|---|---|---|---|---|---|---|---|
| Grain size in outer peripheral edge part (μm) | 20 | 20 | 45 | 55 | 55 | 25 | 45 |
| Grain size in central part (μm) | 10 | 18 | 15 | 20 | 50 | 22 | 35 |
| Magnification (Outer/inner) | 2.0 | 1.1 | 3.0 | 2.8 | 1.1 | 1.1 | 1.3 |
| Ratio of occurrence of peeling (n = 10) | 20% | 10% | 0% | 0% | 0% | 10% | 0% |
| Ratio of occurrence of cracks (n = 10) | 0% | 0% | 0% | 10% | 20% | 0% | 10% |

| Examples | 8 | 9 | 10 | 11 | 12 | 13 |
|---|---|---|---|---|---|---|
| Grain size in outer peripheral edge part (μm) | 45 | 45 | 45 | 30 | 25 | 30 |
| Grain size in central part (μm) | 26 | 16 | 40 | 27 | 10 | 15 |
| Magnification (Outer/inner) | 1.7 | 2.8 | 1.1 | 1.1 | 2.5 | 2.0 |
| Ratio of occurrence of peeling (n = 10) | 0% | 0% | 0% | 0% | 20% | 10% |
| Ratio of Occurrence of cracks (n = 10) | 10% | 0% | 20% | 10% | 0% | 0% |

TABLE 2

| Comparative Examples | 1 | 2 | 3 | 4 | 5 | 6 |
|---|---|---|---|---|---|---|
| Grain size in outer peripheral edge part (μm) | 20 | 60 | 10 | 55 | 55 | 17 |
| Grain size in central part (μm) | 20 | 15 | 10 | 55 | 15 | 15 |

TABLE 2-continued

| Comparative Examples | 1 | 2 | 3 | 4 | 5 | 6 |
|---|---|---|---|---|---|---|
| Magnification (Outer/inner) | 1.0 | 4.0 | 1.0 | 1.0 | 3.7 | 1.1 |
| Ratio of occurrence of peeling (n = 10) | 50% | 0% | 50% | 0% | 0% | 50% |
| Ratio of occurrence of cracks (n = 10) | 0% | 70% | 0% | 50% | 60% | 0% |

In all Examples of the invention, the peeling occurrence rate was low, and the crack occurrence rate was also low at the same time. It is found out that Examples have significant effects, compared to the comparative example.

The invention claimed is:

1. A composite substrate for a semiconductor: said composite substrate comprising a handle substrate and a donor substrate, said handle substrate comprising polycrystalline alumina;

wherein said handle substrate comprises an outer peripheral edge part and a central part, wherein said outer peripheral edge part has an average grain size of 20 to 55 μm; and wherein said central part has an average grain size of 10 to 50 μm;

wherein said average grain size of said outer peripheral edge part of said handle substrate is 1.1 times or more and 3.0 times or less of said average grain size of said central part of said handle substrate, and wherein said handle substrate further comprises a single bonding face comprising a central face part on said central part and an outer peripheral edge face part on said outer peripheral edge part, and wherein said central face part and said outer peripheral edge face part of said bonding face of said handle substrate are bonded to said donor substrate.

2. The composite substrate of claim 1, wherein said donor substrate comprises single crystalline silicon.

* * * * *